US009768695B2

(12) United States Patent
Nomiyama et al.

(10) Patent No.: US 9,768,695 B2
(45) Date of Patent: Sep. 19, 2017

(54) POWER CONVERTING CIRCUIT AND HYSTERESIS BUCK CONVERTER WITH CHANGING RESPONSE CHARACTERISTIC BASED ON TRANSIENT STATE OF OUTPUT VOLTAGE

(71) Applicant: SAMSUNG ELECTRONICS CO., LTD., Suwon-si, Gyeonggi-Do (KR)

(72) Inventors: Takahiro Nomiyama, Seoul (KR); Ilyoung Sohn, Seongham-si (KR); Suho Lee, Yongin-si (KR); Minsoo Cho, Yongin-si (KR); Jaeyeol Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/132,469

(22) Filed: Apr. 19, 2016

(65) Prior Publication Data
US 2016/0336858 A1   Nov. 17, 2016

(30) Foreign Application Priority Data
May 12, 2015  (KR) ........................ 10-2015-0065993

(51) Int. Cl.
G05F 1/56 (2006.01)
H02M 3/158 (2006.01)
(Continued)

(52) U.S. Cl.
CPC ............. *H02M 3/158* (2013.01); *H03K 5/24* (2013.01); *H02M 2001/0025* (2013.01); *H02M 2003/1566* (2013.01)

(58) Field of Classification Search
CPC .................................. G05F 1/56; G05F 1/575
(Continued)

(56) References Cited

U.S. PATENT DOCUMENTS 7,253,593 B1 *  8/2007 Chen ................. H02M 3/158
                                                 323/224
7,714,562 B2 *  5/2010 Oswald ............. H02M 3/1563
                                                 323/284
(Continued)

FOREIGN PATENT DOCUMENTS

JP        4148769 B2    7/2008

*Primary Examiner* — Adolf Berhane
*Assistant Examiner* — Nusrat Quddus
(74) *Attorney, Agent, or Firm* — Volentine & Whitt, PLLC

(57) ABSTRACT

A power converting circuit includes a voltage converting circuit, a feedback circuit, a driving signal generator, a transient state detector, and a resistance value adjuster. The voltage converting circuit changes a voltage level of an input voltage responsive to a driving signal, and outputs an output voltage according to the changed voltage level of the input voltage. The feedback circuit divides the output voltage to output the divided output voltage as a feedback voltage. The driving signal generator compares a level of the feedback voltage with a level of a reference voltage and outputs the driving signal. The transient state detector compares the level of the feedback voltage with the level of the reference voltage and outputs a transient state signal corresponding to a transient state of the output voltage. The resistance value adjuster adjusts the feedback resistance value, which divides the output voltage, responsive to the transient state signal.

20 Claims, 14 Drawing Sheets

(51) Int. Cl.
*H03K 5/24* (2006.01)
*G05F 1/575* (2006.01)
*H02M 1/00* (2006.01)
*H02M 3/156* (2006.01)

(58) Field of Classification Search
USPC .................................................. 323/271–286
See application file for complete search history.

(56) References Cited

U.S. PATENT DOCUMENTS

| | | | |
|---|---|---|---|
| 8,138,739 B1 * | 3/2012 | Eirea ................... | H02M 3/1588 |
| | | | 323/271 |
| 8,212,538 B2 * | 7/2012 | Nishida ............... | H02M 3/1563 |
| | | | 323/271 |
| 8,314,598 B2 * | 11/2012 | Chen ..................... | H02M 3/156 |
| | | | 323/282 |
| 8,358,114 B1 | 1/2013 | Ferris et al. | |
| 8,633,680 B2 | 1/2014 | Zhao et al. | |
| 8,779,731 B2 | 7/2014 | Menegoli et al. | |
| 8,907,644 B2 | 12/2014 | Menegoli et al. | |
| 2013/0106385 A1 | 5/2013 | Smith, Jr. et al. | |
| 2013/0342181 A1 | 12/2013 | Sappanz et al. | |

* cited by examiner

POWER CONVERTING CIRCUIT AND HYSTERESIS BUCK CONVERTER WITH CHANGING RESPONSE CHARACTERISTIC BASED ON TRANSIENT STATE OF OUTPUT VOLTAGE

CROSS-REFERENCE TO RELATED APPLICATIONS

A claim of priority under 35 U.S.C. §119 is made to Korean Patent Application No. 10-2015-0065993 filed May 12, 2015, in the Korean Intellectual Property Office, the entire contents of which are hereby incorporated by reference.

BACKGROUND

Embodiments of the inventive concept herein relate to a semiconductor device, and more particularly, to a power converting circuit and a hysteresis buck converter, capable of changing a response characteristic based on a transient state of an output voltage.

Electric circuits perform functions by means of electric signals. The electric signals may be of various forms (e.g., an alternating current (AC) and a direct current (DC)) and various characteristics (e.g., a voltage and a current). Electric circuits typically convert a form and a characteristic of an electric signal. For example, electric circuits may convert an electric signal from AC to DC, and may furthermore convert an electric signal in the form of a voltage into a current.

As the use of mobile devices increases, the demand for high-efficiency DC-DC converters is increasing. Power amplifiers which are implemented at a radio frequency (RF) stage of a mobile device must necessarily have a high-speed voltage response characteristic. Generally, as power consumption of power converting circuits increases, the voltage response characteristic becomes better. However, mobile devices are typically designed and implemented to consume low power, due to limited available power. To satisfy the conflicting conditions, mobile devices may be designed to include a converter with a hysteresis mode as the power converting circuit. Such converters exhibit a high-speed response characteristic while consuming less power, by using a relatively simple circuit configuration.

SUMMARY

The inventive concepts herein are directed to providing a power converting circuit and a hysteresis buck converter, capable of obtaining a high-speed response characteristic while maintaining low power consumption and stability of an output voltage.

Embodiments of the inventive concept are directed to providing a power converting circuit including a voltage converting circuit configured to change a voltage level of an input voltage in response to a driving signal and to output an output voltage according to the changed voltage level of the input voltage; a feedback circuit configured to divide the output voltage and to output the divided output voltage as a feedback voltage; a driving signal generator configured to compare a level of the feedback voltage with a level of a reference voltage and to output the driving signal; a transient state detector configured to compare the level of the feedback voltage with the level of the reference voltage and to output a transient state signal corresponding to a transient state of the output voltage; and a resistance value adjuster configured to change a feedback resistance value, which divides the output voltage, in response to the transient state signal.

In embodiments of the inventive concept, the voltage converting circuit may include a first transistor configured to transfer the input voltage provided to one end of the first transistor into the other end of the first transistor in response to a first driving signal; a second transistor configured to transfer a ground voltage provided to one end of the second transistor into the other end of the second transistor in response to a second driving signal; an inductor connected between the other end of the first transistor and an output node; and a capacitor connected between the output node and a ground node, wherein the voltage converting circuit output the output voltage to the output node.

In embodiments of the inventive concept, the driving signal generator may include a hysteresis comparator configured to compare the level of the feedback voltage with the level of the reference voltage and to output a comparison signal; and a gate controller configured to output the first driving signal and the second driving signal respectively to a gate of the first transistor and a gate of the second transistor, in response to the comparison signal.

In embodiments of the inventive concept, the feedback circuit may include a first feedback resistor connected between the output node and a feedback voltage node to output the feedback voltage; and a second feedback resistor connected between the feedback voltage node and the ground node.

In embodiments of the inventive concept, the transient state detector may include a state comparator configured to compare the level of the feedback voltage with the level of the reference voltage, and output a first transient state signal and a second transient state signal, wherein the state comparator is configured to output the first transient state signal from a first time point, at which a level difference between the feedback voltage and the reference voltage is greater than a threshold voltage of the state comparator, to a second time point, at which a level difference between the feedback voltage and the reference voltage is less than the threshold voltage of the state comparator and to output the second transient state signal during a second section other than a first section between the first time point and the second time point.

In embodiments of the inventive concept, the resistance value adjuster may be configured to change the feedback resistance value from a first value to a second value when the transient state signal is the first transient state signal, and to change the feedback resistance value from the second value to the first value when the transient state signal is the second transient state signal and the second value is less than the first value Embodiments of the inventive concept are also directed to providing a hysteresis buck converter which steps down an input voltage and outputs the stepped-down voltage as an output voltage. The hysteresis buck converter may include a feedback circuit configured to divide the output voltage and to output the divided output voltage as a feedback voltage; a hysteresis comparator configured to compare a level of the feedback voltage with a level of a reference voltage and to output a comparison signal; a voltage converting circuit configured to pull up or down the input voltage based on the comparison signal and to output the pulled-up or pulled-down voltage as the output voltage; and a resistance value control circuit configured to change a feedback resistance value, which divides the output voltage, based on a transient state of the feedback voltage, wherein the resistance value control circuit may decrease the feedback resistance value during a rising transient section of the feedback voltage.

Further embodiments of the inventive concept are directed to providing a power converting circuit including a voltage converting circuit configured to output an output voltage based on an input voltage and a driving signal; a feedback circuit configured to divide the output voltage and to output the divided output voltage as a feedback voltage; a ripple voltage injection circuit configured to output a ripple voltage to a feedback node outputting the feedback voltage; a driving signal generator configured to compare a level of the feedback voltage with a level of a reference voltage and to output the driving signal; and a resistance value control circuit configured to change a feedback resistance value, which divides the output voltage, in response to a transient state of the feedback voltage, wherein the resistance value control circuit decreases the feedback resistance value during a rising transient section of the feedback voltage.

BRIEF DESCRIPTION OF THE FIGURES

Exemplary embodiments of the inventive concept will be more clearly understood from the following detailed description taken in conjunction with the accompanying drawings in which.

DETAILED DESCRIPTION

Figure 1:
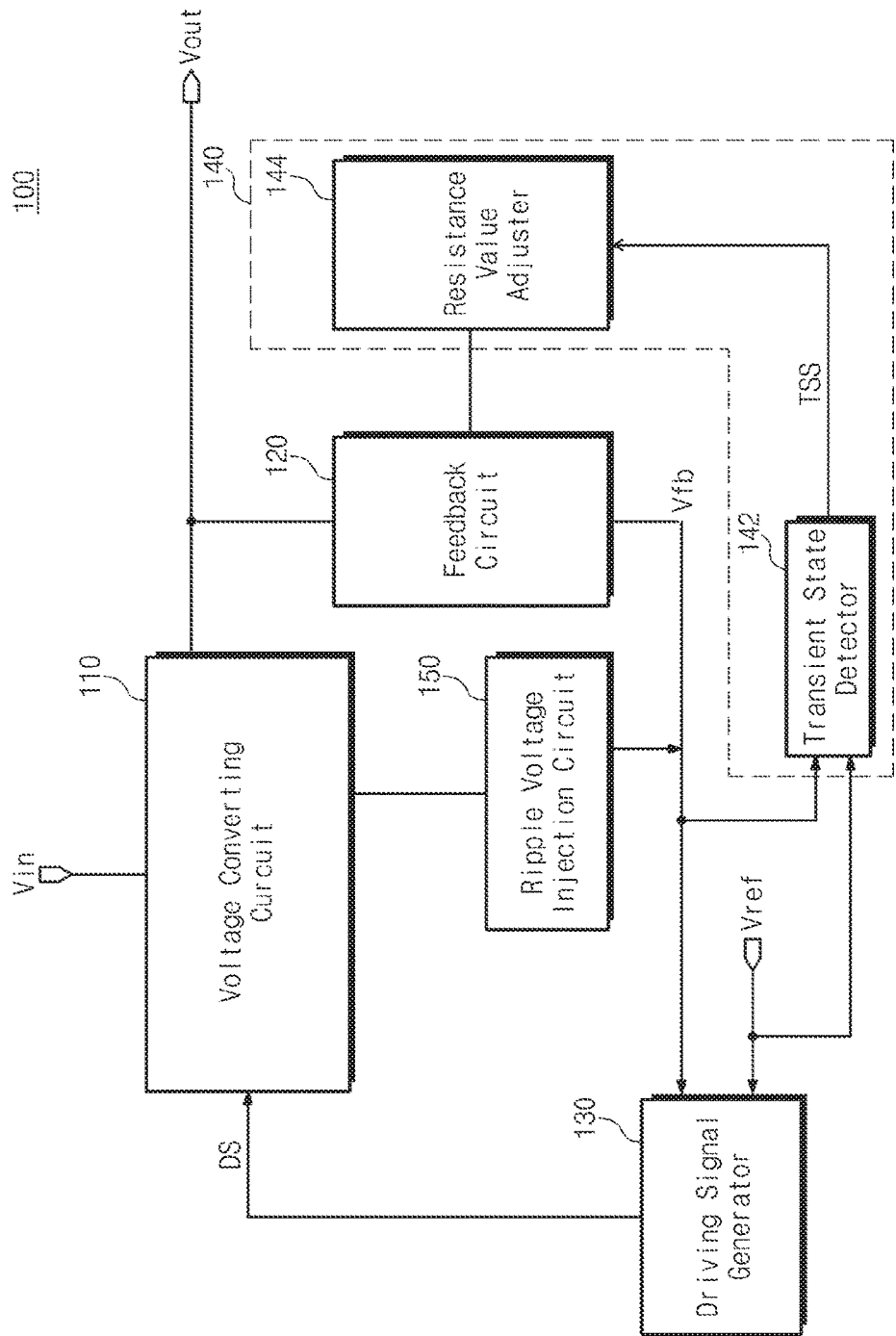
FIG. 1 is a block diagram schematically illustrating a power converting circuit, according to an embodiment of the inventive concept.

The above-described aspects and the following detailed description are provided to help understanding of the inventive concept. However, the inventive concept may be implemented in different forms, and should not be limited by the following description. The following embodiments may be exemplifications for fully disclosing the inventive concept and explaining the inventive concept to one skilled in the art. Accordingly, in the case where various methods for implementing components of the inventive concept exist, embodiments of the inventive concept may be implemented with any specific one from among the various methods, or any methods the may be the same as the various methods.

In this specification, in the case where any configuration is mentioned as including specific elements, or in the case where any procedure is mentioned as including specific steps, any other elements or steps may be further included. That is, terms disclosed herein may be for describing a specific embodiment, but should not be limited thereto. In addition, exemplifications described for understanding of the inventive concept may include complementary embodiments thereof.

It should be understood that, although the terms "first," "second," "A," "B," etc. may be used herein in reference to elements of the inventive concept, such elements should not be construed as being limited by these terms. For example, a first element could be termed a second element, and a second element could be termed a first element, without departing from the scope of the inventive concept. Herein, the term "and/or" includes any and all combinations of one or more referents.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to as in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this inventive concept belongs.

It should be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

Embodiments of the present inventive concept will be described below with reference to the attached drawings.

FIG. 1 is a block diagram schematically illustrating a power converting circuit according to an embodiment of the inventive concept. Referring to FIG. 1, a power converting circuit 100 includes a voltage converting circuit 110, a feedback circuit 120, a driving signal generator 130, a resistance value control circuit 140, and a ripple voltage injection circuit 150. The power converting circuit 100 may receive an input voltage Vin and may output an output voltage Vout.

The voltage converting circuit 110 may be provided with the input voltage Vin. The voltage converting circuit 110 may receive a driving signal DS. The voltage converting circuit 110 may output the output voltage Vout in response to the driving signal DS. An embodiment of the inventive concept associated with a configuration and an operation of the voltage converting circuit 110 will be given together with a description of FIG. 2.

The feedback circuit 120 may divide the output voltage Vout and may output the divided voltage as a feedback voltage Vfb. The feedback circuit 120 may include feedback resistors for dividing the output voltage Vout. A voltage level of the feedback voltage Vfb may be adjusted in proportion to a voltage level of the output voltage Vout. A configuration and a function of the feedback circuit 120 may be given together with a description of FIGS. 5A and 5B.

The driving signal generator 130 may receive the feedback voltage Vfb. The driving signal generator 130 may receive a reference voltage Vref. The driving signal generator 130 may compare a voltage level of the feedback voltage Vfb with a voltage level of the reference voltage Vref. The driving signal generator 130 may generate the driving signal DS based on the comparison result. A configuration and an operation of the driving signal generator 130 will be given together with a description of FIG. 3.

The resistance value control circuit 140 includes a transient state detector 142 and a resistance value adjuster 144. The transient state detector 142 may compare a voltage level of the feedback voltage Vfb with a voltage level of the reference voltage Vref and may output a transient state signal TSS corresponding to a transient state of the output voltage Vout. The resistance value adjuster 144 may adjust a feedback resistance value in response to the transient state signal TSS. For example, the resistance value control circuit 140 may permit the feedback resistance value to be decreased during a rising transient section of the output voltage Vout. Here, the feedback resistance value may mean an equivalent resistance value of resistors which divide an output voltage Vout and outputs the divided voltage as the feedback voltage Vfb.

The ripple voltage injection circuit 150 may output a ripple voltage to a node from which the feedback voltage Vfb is outputted. In embodiments of the inventive concept, the ripple voltage injection circuit 150 may include an impedance element and reactance elements.

Figure 2:
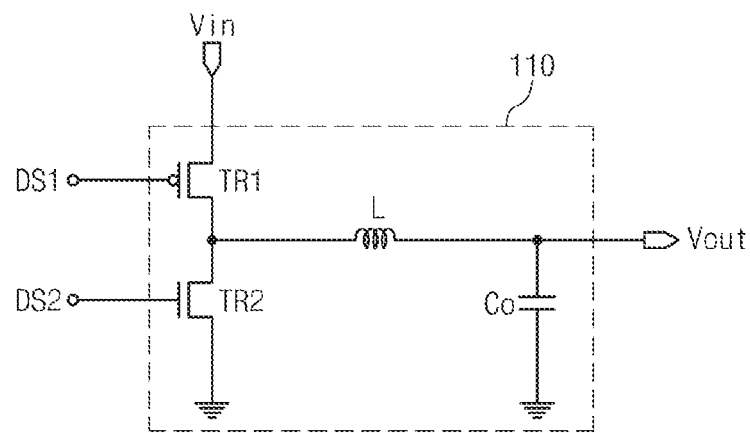
FIG. 2 is a schematic diagram illustrating a voltage converting circuit illustrated in FIG. 1.

FIG. 2 is a schematic diagram illustrating a voltage converting circuit illustrated in FIG. 1. Referring to FIG. 2, the voltage converting circuit 110 includes a first transistor TR1, a second transistor TR2, an inductor L, and a capacitor Co.

One end of the first transistor TR1 is connected to a node for receiving an input voltage Vin. The second transistor TR2 is connected between the other end of the first transistor TR1 and a ground node. The first transistor TR1 and the second transistor TR2 may be controlled by a first driving signal DS1 and a second driving signal DS2, respectively. The first driving signal DS1 and the second driving signal DS2 may be included in a driving signal DS (refer to FIG. 1) that the driving signal generator 130 (refer to FIG. 1) generates. The first transistor TR1 and the second transistor TR2 may be sequentially turned on in response to the first driving signal DS1 and the second driving signal DS2, respectively.

One end of the inductor L is connected to the other end of the first transistor TR1. A level of a current which flows through the inductor L by the input voltage Vin may increase when the first transistor TR1 is turned on and the second transistor TR2 is turned off. In contrast, a level of a current which flows through the inductor L by a ground voltage which is a voltage level of the ground node may decrease when the first transistor TR1 is turned off and the second transistor TR2 is turned on. With the above-described operation, the output voltage Vout may be outputted through the inductor L.

The capacitor Co is connected between a node for outputting the output voltage Vout and the ground node. The capacitor Co may be connected to output the output voltage Vout stably.

The voltage converting circuit 110 may control turn-on and turn-off times of the first and second transistors TR1 and TR2 to adjust a level of the output voltage Vout.

In an embodiment of the inventive concept shown in FIG. 2, the inductor L is a discrete inductor and the capacitor Co is a discrete capacitor. However, the scope and spirit of the inventive concept should not be limited thereto. For example, the inductor L may be implemented with a simulated inductor which includes an operational amplifier and a capacitor. The capacitor Co may be implemented with any element which is capable of charging and discharging charges. Furthermore, a configuration of the voltage converting circuit 110 of FIG. 2 may be exemplary, and the voltage converting circuit 110 may be configured to be different from that illustrated in FIG. 2. The scope and spirit of the inventive concept should not be limited to FIG. 2.

Figure 3:
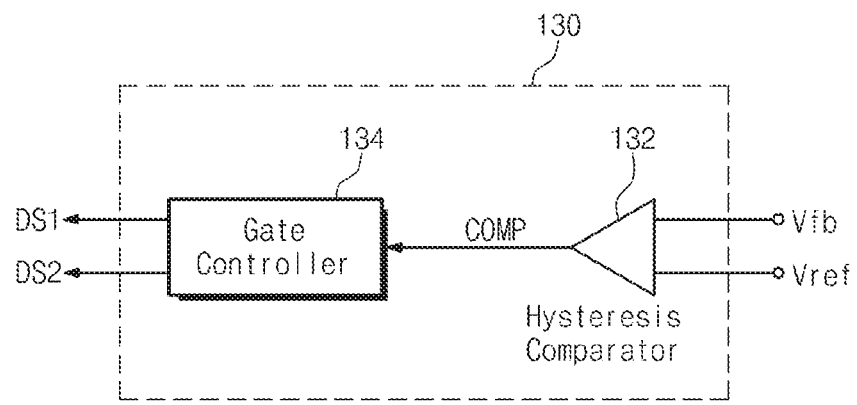
FIG. 3 is a schematic diagram illustrating a configuration of a driving signal generator illustrated in FIG. 1.

FIG. 3 is a schematic diagram illustrating a configuration of a driving signal generator illustrated in FIG. 1. Referring to FIG. 3, the driving signal generator 130 includes a hysteresis comparator 132 and a gate controller 134.

The hysteresis comparator 132 may compare a feedback voltage Vfb and a reference voltage Vref and may output a comparison signal COMP. Here, the reference voltage Vref may include a first hysteresis threshold voltage and a second hysteresis threshold voltage. In embodiments of the inventive concept, the hysteresis comparator 132 may output the comparison signal COMP having a logic "high" state when a level of the feedback voltage Vfb is higher than that of the first hysteresis threshold voltage. The hysteresis comparator 132 may keep the comparison signal COMP as having a logic "high" state as long as a level of the feedback voltage Vfb is not lower than that of the second hysteresis threshold voltage. The hysteresis comparator 132 may output the comparison signal COMP as having a logic "low" state when a level of the feedback voltage Vfb is lower than that of the second hysteresis threshold voltage. The hysteresis comparator 132 may keep the comparison signal COMP as having a logic "low" state as long as a level of the feedback voltage Vfb is not higher than that of the first hysteresis threshold voltage.

The gate controller 134 may receive the comparison signal COMP and may output a first driving signal DS1 and a second driving signal DS2. The first and second driving signals DS1 and DS2 may be used to turn on or off the first and second transistors TR1 and TR2. Logic states of the first driving signals DS1 and DS2 may vary according to a change in a transient state of the feedback voltage Vfb, which is a voltage obtained by dividing the output voltage Vout.

Figure 4:
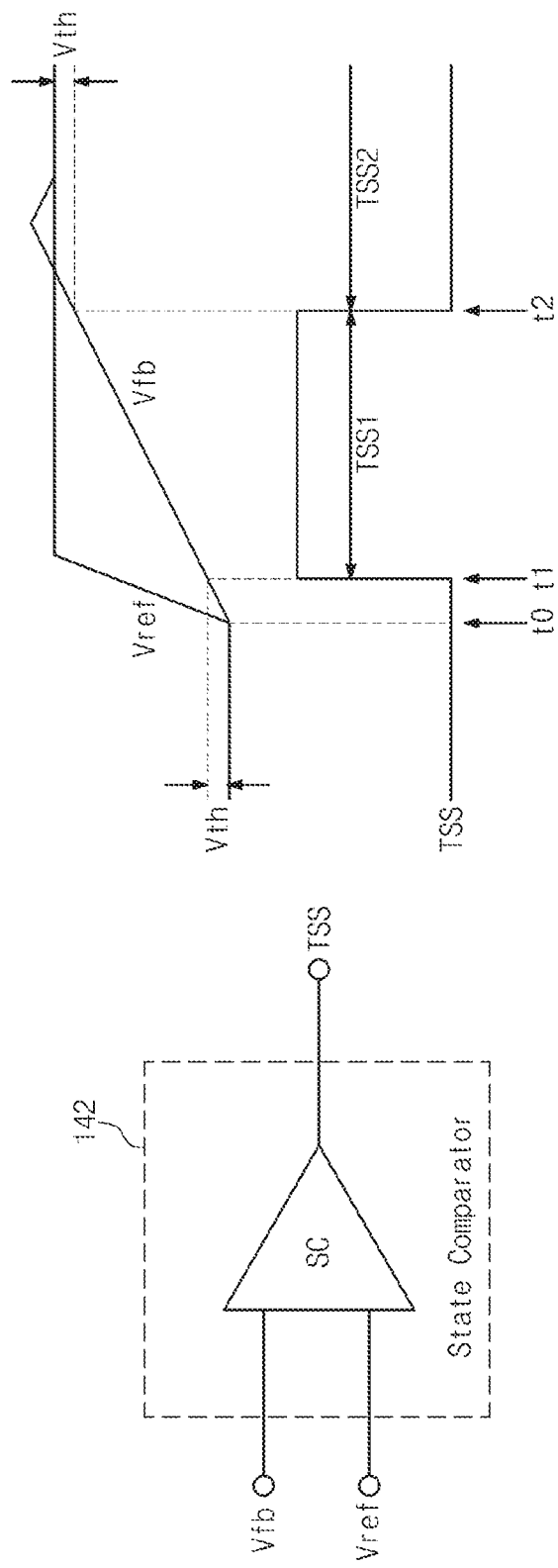
FIG. 4 is a schematic diagram illustrating a configuration of a transient state detector illustrated in FIG. 1 and a timing diagram for describing an operation of the transient state detector.

FIG. 4 is a schematic diagram illustrating a configuration of a transient state detector 142 illustrated in FIG. 1 and a timing diagram for describing an operation of the transient state detector 142. The transient state detector 142 may include a state comparator SC.

The state comparator SC may receive a feedback voltage Vfb and a reference voltage Vref and may output a transient state signal TSS. The transient state signal TSS may be a signal corresponding to a transient state of an output voltage Vout. In embodiments of the inventive concept, the transient state signal TSS may remain at a logic "high" state during a rising transient section of the output signal Vout and may remain at a logic "low" state during the remaining section other than the rising transient section. The state comparator SC will be more fully described with reference to a timing diagram of FIG. 4.

At t0, the reference voltage Vref may be applied to the state comparator SC, and a level of the feedback voltage Vfb may start increasing. The state comparator SC may compare the feedback voltage Vfb and the reference voltage Vref and may output the transient state signal TSS. The state comparator SC may output the transient state signal TSS with a logic "low" state until t1 when a difference between the feedback voltage Vfb and the reference voltage Vref is substantially the same as a threshold voltage Vth of the state comparator SC.

The difference between the feedback voltage Vfb and the reference voltage Vref may become substantially the same as a threshold voltage Vth of the state comparator SC at t1, and it may gradually increase after t1. The state comparator SC may output a first transient state signal TSS1 of a logic "high" state from t1. Here, the logic "high" state of the transient state signal TSS may mean that the feedback voltage Vfb is increasing. Since the feedback voltage Vfb is a voltage obtained by dividing the output voltage Vout, the logic "high" state of the transient state signal TSS may mean that the output voltage Vout is increasing.

At t2, the difference between the feedback voltage Vfb and the reference voltage Vref may become substantially the same as the threshold voltage Vth of the state comparator SC. At this time, the state comparator SC may make the transient state signal TSS transient to a logic "low" state. That is, the state comparator SC may output a second transient state signal TSS2 of a logic "low" state. The feedback voltage Vfb may increase during a time even after t2, but the state comparator SC may change a logic state of the transient state signal TSS at t2. This may be for limiting overshooting of the output voltage Vout caused due to a change in a feedback resistance value according to the transient state signal TSS.

The above-described logic states of the transient state signal TSS may be exemplary. It should be understood that the first transient state signal TSS1 may instead be a signal of a logic "low" state and the second transient state signal TSS2 may instead be a signal of a logic "high" state.

With the above description, the state comparator SC may search for a rising transient section of the feedback voltage Vfb. The state comparator SC may output the first transient state signal TSS1 corresponding to the found rising transient section and may output the second transient state signal TSS2 during the remaining transient section.

As described above, the state comparator SC may search for a rising transient section of the feedback voltage Vfb and may output the transient state signal TSS corresponding to the found rising transient section. The transient state detector 142 may output the first transient state signal TSS1 indicating that the output voltage Vout remains at a rising transient state.

Figure 5A:
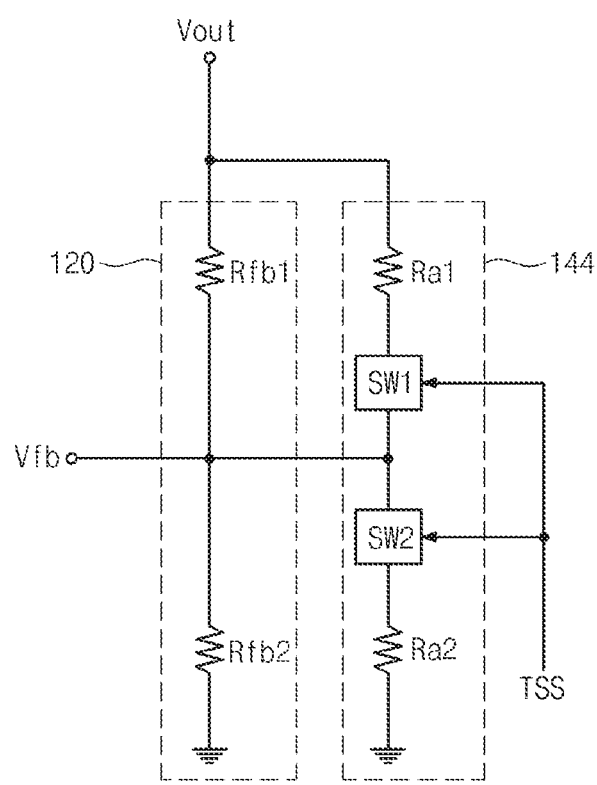
FIG. 5A is a schematic diagram illustrating a feedback circuit and a resistance value adjuster illustrated in FIG. 1, according to an embodiment of the inventive concept.
Figure 5B:
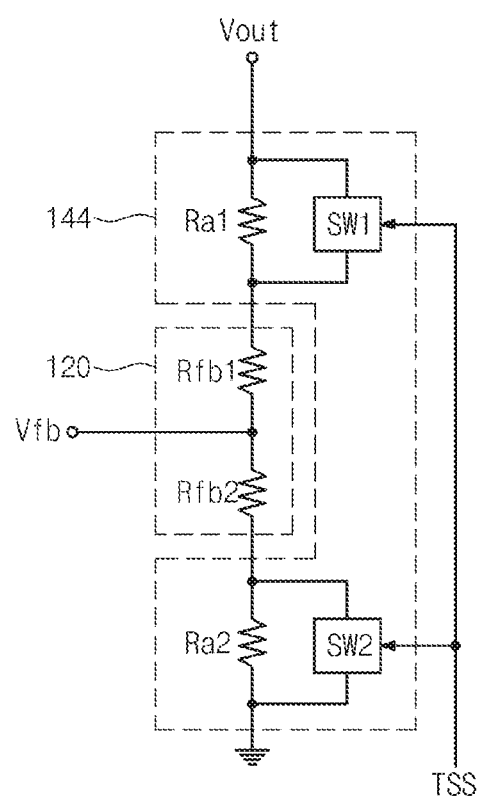
FIG. 5B is a schematic diagram illustrating a feedback circuit and a resistance value adjuster illustrated in FIG. 1, according to another embodiment of the inventive concept.

FIGS. 5A and 5B are schematic diagrams illustrating a configuration of a feedback circuit and a configuration of a resistance value adjuster illustrated in FIG. 4. Referring to FIGS. 5A and 5B, the feedback circuit 120 includes feedback resistors Rfb1 and Rfb2. The resistance value adjuster 144 includes adjustment resistors Ra1 and Ra2 and switches SW1 and SW2.

FIG. 5A is a schematic diagram illustrating a feedback circuit and a resistance value adjuster illustrated in FIG. 1, according to an embodiment of the inventive concept.

The feedback circuit 120 includes the first feedback resistor Rfb1 and the second feedback resistor Rfb2 which are used to divide the output voltage Vout and output the feedback voltage Vfb. A level of the feedback voltage Vfb may be adjusted in proportion to resistance values of the first feedback resistor Rfb1 and the second feedback resistor Rfb2. In embodiments of the inventive concept, in the case where the first feedback resistor Rfb1 and the second feedback resistor Rfb2 have the same resistance value, a level of the feedback voltage Vfb may be half a level of the output voltage Vout.

The resistance value adjuster 144 includes the first adjustment resistor Ra1 which is connected in parallel with the first feedback resistor Rfb1 or is disconnected there from, based on whether the first switch SW1 is turned off or on. The resistance value adjuster 144 further includes the second adjustment resistor Ra2 which is connected in parallel with the second feedback resistor Rfb2 or is disconnected there from, based on whether the second switch SW2 is turned off or on. The resistance value adjuster 144 may adjust a feedback resistance value of the power converting circuit 100 (refer to FIG. 1), based on whether the first switch SW1 and the second switch SW2 are turned on or off. For example, when the first switch SW1 and the second switch SW2 are turned off, the feedback resistance value of the power converting circuit 100 may be resistance values of the first and second feedback resistors Rfb1 and Rfb2. However, when the first switch SW1 and the second switch SW2 are turned on, the feedback resistance value of the power converting circuit 100 may be an equivalent resistance value of the first feedback resistor Rfb1 and the first adjustment resistor Ra1 connected in parallel and an equivalent resistance value of the second feedback resistor Rfb2 and the second adjustment resistor Ra2 connected in parallel.

The first switch SW1 and the second switch SW2 may be turned on or off in response to the transient state signal TSS. In embodiments of the inventive concept, the first switch SW1 and the second switch SW2 may be turned on in response to the first transient state signal TSS1 of FIG. 4. In embodiments of the inventive concept, the first switch SW1 and the second switch SW2 may be turned off in response to the second transient state signal TSS2.

When the first switch SW1 is turned on, the first feedback resistor Rfb1 and the first adjustment resistor Ra1 may be connected in parallel with each other. When the second switch SW2 is turned on, the second feedback resistor Rfb2 and the second adjustment resistor Ra2 may be connected in parallel with each other. In this case, an output voltage Vout may be divided in proportion to an equivalent resistance value of the first feedback resistor Rfb1 and the first adjustment resistor Ra1 connected in parallel and an equivalent resistance value of the second feedback resistor Rfb2 and the second adjustment resistor Ra2 connected in parallel. That is, in the case where the first feedback resistor Rfb1 and the first adjustment resistor Ra1 are connected in parallel, an equivalent resistance value of the first feedback resistor Rfb1 and the first adjustment resistor Ra1 connected in parallel may be the feedback resistance value. Here, the feedback resistance value being an equivalent resistance value of the first feedback resistor Rfb1 and the first adjustment resistor Ra1 connected in parallel with each other may be smaller than that of the first feedback resistor Rfb1. Likewise, the feedback resistance value being an equivalent resistance value of the second feedback resistor Rfb2 and the second adjustment resistor Ra2 connected in parallel with each other may be smaller than that of the second feedback resistor Rfb2. In detail, an equivalent resistance value of the first feedback resistor Rfb1 and the first adjustment resistor Ra1 as a feedback resistance value after the first adjustment resistor Ra1 and the first feedback resistor Rfb1 are connected in parallel with each other may be smaller than a resistance value of the first feedback resistor Rfb1 as a feedback resistance value before the first adjustment resistor Ra1 and the first feedback resistor Rfb1 are connected in parallel with each other.

In embodiments of the inventive concept, a resistance value of the first adjustment resistor Ra1 may be set such that a feedback resistance value being an equivalent resistance value when the first adjustment resistor Ra1 is connected with the first feedback resistor Rfb1 is 0.1 times a resistance value of the first feedback resistor Rfb1 being a feedback resistance value before being connected with the first adjustment resistor Ra1. In embodiments of the inventive concept, a resistance value of the second adjustment resistor Ra2 may be set such that a feedback resistance value when the second adjustment resistor Ra2 is connected with the second feedback resistor Rfb2 is 0.1 times a resistance value of the second feedback resistor Rfb2 being a feedback resistance value before being connected with the second adjustment resistor Ra2. The above-described resistance values may be exemplary, and resistance values of the first and second adjustment resistors Ra1 and Ra2 may be variously set without being limited thereto.

When the first and second switches SW1 and SW2 are turned off, a connection between the first feedback resistor Rfb1 and the first adjustment resistor Ra1, and a connection between the second feedback resistor Rfb2 and the second adjustment resistor Ra2 may be cut. In this case, a feedback resistance value of the power converting circuit 100 may be a resistance value of the first and second feedback resistors Rfb1 and Rfb2.

FIG. 5B is a schematic diagram illustrating a feedback circuit and a resistance value adjuster illustrated in FIG. 1, according to another embodiment of the inventive concept. The resistance value adjuster 144 may include adjustment resistors Ra1 and Ra2 and switches SW1 and SW2. Components of the feedback circuit 120 may be substantially the same as those of FIG. 5A, and a description thereof is thus omitted.

The first adjustment resistor Ra1 is connected in serial to the first feedback resistor Rfb1. The first switch SW1 is connected in parallel with the first adjustment resistor Ra1. The second adjustment resistor Ra2 is connected in serial to the second feedback resistor Rfb2. The second switch SW2 is connected in parallel with the second adjustment resistor Ra2.

When the first switch SW1 and the second switch SW2 are turned off, the output voltage Vout may be divided according to a feedback resistance value being an equivalent resistance value of the first adjustment resistor Ra1 and the first feedback resistor Rfb1 and a feedback resistance value being an equivalent resistance value of the second adjustment resistor Ra2 and the second feedback resistor Rfb2.

When the first switch SW1 and the second switch SW2 are turned on, the output voltage Vout may be divided according to a resistance value of the first feedback resistor Rfb1 and a resistance value of the second feedback resistor Rfb2.

The first switch SW1 and the second switch SW2 may be turned on in response to the first transient state signal TSS1 (refer to FIG. 4). The first switch SW1 and the second switch SW2 may be turned off in response to the second transient state signal TSS2 (refer to FIG. 4).

In embodiments of the inventive concept, a resistance value of the first adjustment resistor Ra1 may be set such that an equivalent resistance value of the first feedback resistor Rfb1 and the first adjustment resistor Ra1 is 0.1 times a resistance value of the first feedback resistor Rfb1. In embodiments of the inventive concept, a resistance value of the second adjustment resistor Ra2 may be set such that an equivalent resistance value of the second feedback resistor Rfb2 and the second adjustment resistor Ra2 is 0.1 times a resistance value of the second feedback resistor Rfb2. The above-described resistance values may be exemplary, and resistance values of the first and second adjustment resistors Ra1 and Ra2 may be variously set without being limited thereto.

A configuration and an operation of the resistance value adjuster 144 are described with reference to FIGS. 5A and 5B. However, the scope and spirit of the inventive concept should not be limited thereto. For example, each of the feedback resistors Rfb1 and Rfb2 may be implemented to be variable, and a resistance value thereof may be adjusted according to the transient state signal TSS. In this case, when the transient state signal TSS indicates a rising transient state of an output voltage, the variable feedback resistors may be controlled such that resistance values thereof are decreased.

When the output voltage Vout increases (at a rising transition), the power converting circuit 100 which includes a configuration described with reference to FIGS. 1 to 5 may adjust a feedback resistance value to allow a rising transient speed of the output voltage Vout to become faster. That is, the power converting circuit 100 may detect a rising transient of the output voltage Vout by means of the transient state detector 142; and when the output voltage Vout is detected as remaining at a rising transient state, the power converting circuit 100 may adjust the feedback resistance value by means of the resistance value adjuster 144 to allow the feedback resistance value to be decreased. During the remaining section other than the rising transient section of the output voltage Vout, the resistance value adjuster 144 may be controlled such that there are maintained a feedback resistance value before the feedback resistance value is decreased.

With the above description, the power converting circuit 100 may adjust feedback resistance value, and thus, may improve a rising transient speed of the output voltage Vout.

Figure 6:
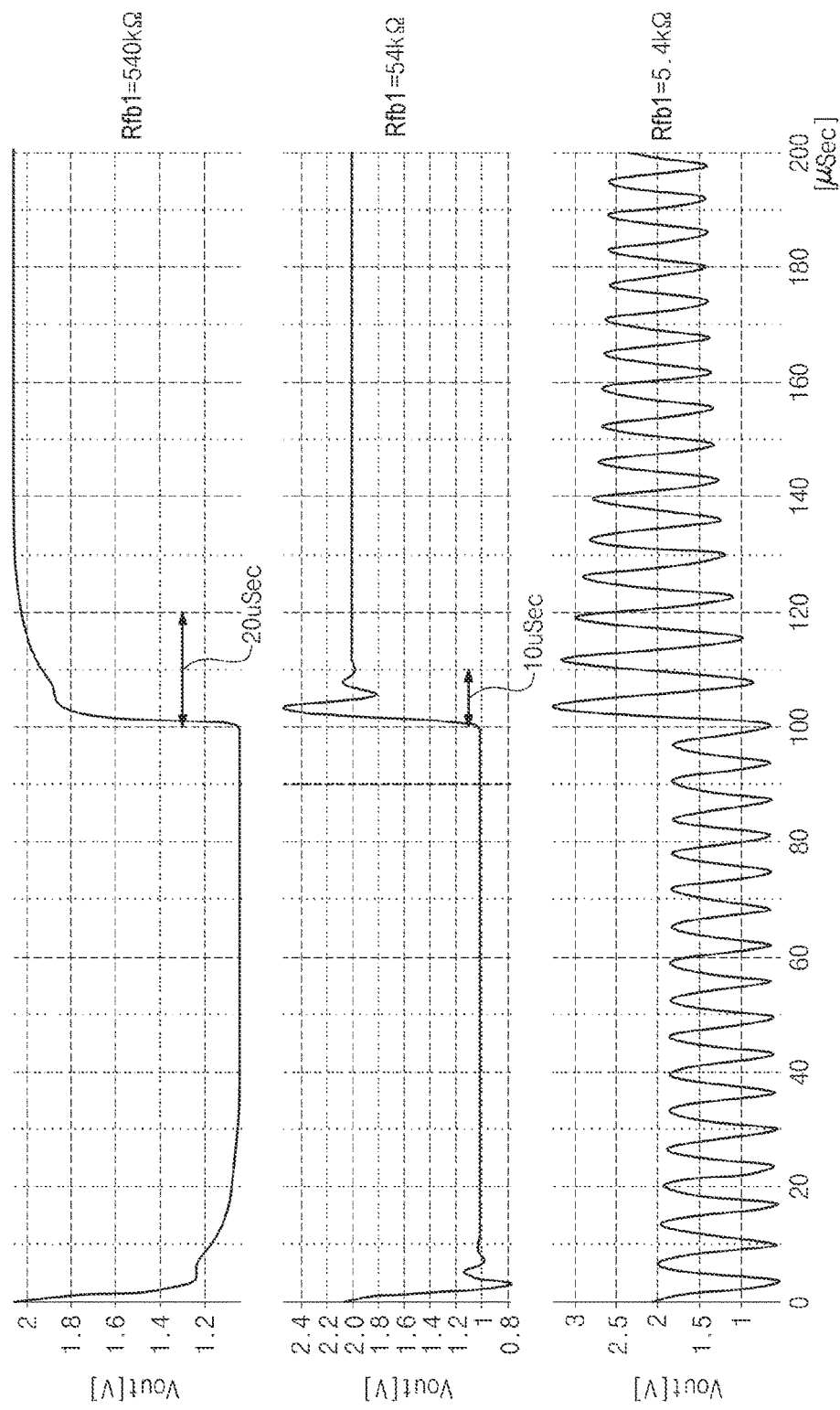
FIG. 6 is a graph illustrating a relation between a transient state of an output voltage and a resistance value of a feedback resistor in a power converting circuit.

FIG. 6 is a graph illustrating a relation between a transient state of an output voltage and a resistance value of a feedback resistor in a power converting circuit. Referring to FIG. 6, there are illustrated respective waveforms of output voltages Vout when a resistance value of the feedback resistor Rfb1 is 540 kΩ, 54 kΩ, and 5.4 kΩ.

In the case where the feedback resistor Rfb1 has a resistance value of 540 kΩ, as understood from FIG. 6, a time of about 20 µs may be taken until the output voltage Vout reaches a target voltage. Furthermore, in this case, the output voltage Vout may reach the target voltage without overshooting.

In the case where the feedback resistor Rfb1 has a resistance value of 54 kΩ, as understood from FIG. 6, a time of about 10 µs may be taken until the output voltage Vout reaches a target voltage. Furthermore, in this case, overshooting may occur at the output voltage Vout.

In the case where the feedback resistor Rfb1 has a resistance value of 5.4 kΩ, as understood from FIG. 6, the output voltage Vout may oscillate without converging into the target voltage.

The power converting circuit 100 may be used to output an output voltage of a desired level based on an input voltage. For this reason, if the output voltage Vout oscillates, the power converting circuit 100 may not perform its own function.

In the case where the power converting circuit 100 must increase an output voltage up to a target voltage quickly, as described above, it may be desirable to use the feedback resistor Rfb1 of about 54 kΩ rather than the feedback resistor Rfb1 of about 540 kΩ. In this case, compared to the case that the feedback resistor Rfb1 of about 540 kΩ is used, stability of the output voltage may become low. With the above description, in the case where the output voltage Vout reaches a target voltage, a resistance value of the feedback resistor Rfb1 that is maintained with 540 kΩ may be desirable in terms of stability of circuit.

In the power converting circuit 100 according to embodiments of the inventive concept, the resistance value control circuit 140 may change a feedback resistance value to increase the output voltage Vout quickly. To this end, the power converting circuit 100 according to embodiments of the inventive concept may allow a feedback resistance value to decrease within a rising transient section of the output voltage Vout, and thus the output voltage Vout may reach a target voltage more quickly.

Figure 7A:
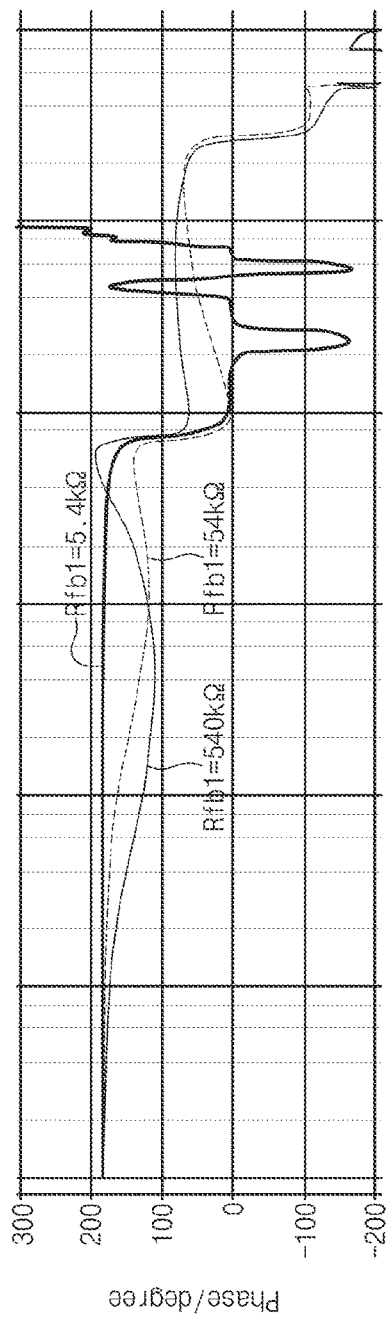
FIGS. 7A and 7B are graphs illustrating an operating characteristic of a power converting circuit according to a feedback resistance value.
Figure 7B:
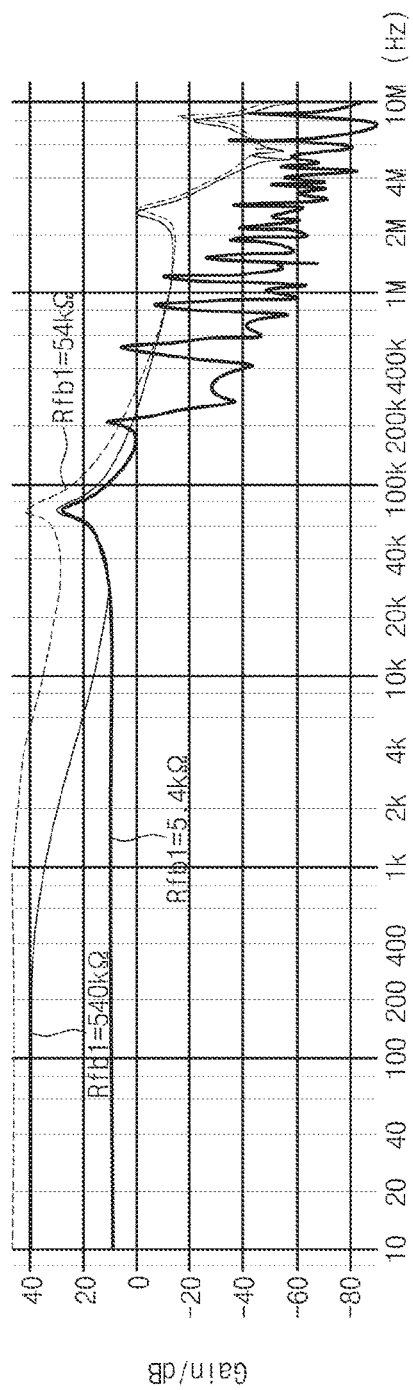

FIGS. 7A and 7B are graphs illustrating an operating characteristic of a power converting circuit according to a feedback resistance value. FIG. 7A shows a phase margin of a power converting circuit according to a feedback resistance value, and FIG. 7B shows an open-loop DC gain and a bandwidth of the power converting circuit according to a feedback resistance value.

Referring to FIG. 7A, it should be understood that a phase margin is reduced as a resistance value of the feedback resistor Rfb1 decreases. That is, a phase margin when the feedback resistor Rfb1 has a resistance value of about 5.4 kΩ may be about 0 degree, a phase margin when the feedback resistor Rfb1 has a resistance value of about 54 kΩ may be about 37 degrees, and a phase margin when the feedback resistor Rfb1 has a resistance value of about 540 kΩ may be about 73 degrees.

Referring to FIG. 7B, it should be understood that a bandwidth and an open-loop DC gain increase as a resistance value of the feedback resistor Rfb1 decreases. That is, a bandwidth may be about 230 kHz when the feedback resistor Rfb1 has a resistance value of about 540 kΩ and about 330 kHz when the feedback resistor Rfb1 has a resistance value of about 54 kΩ.

As described above, a resistance value of a feedback resistor may affect a system loop characteristic of a power converting circuit. That is, when a resistance value of the feedback resistor Rfb1 decreases, an open-loop DC gain and a bandwidth may increase, while stability of system may become worse. In contrast, when a resistance value of the feedback resistor Rfb1 increases, the open-loop DC gain and the bandwidth may decrease, while stability of system may become better.

With the above description, as a resistance value of the feedback resistor Rfb1 decreases, an output voltage of a power converting circuit may increase more quickly.

Figure 8:
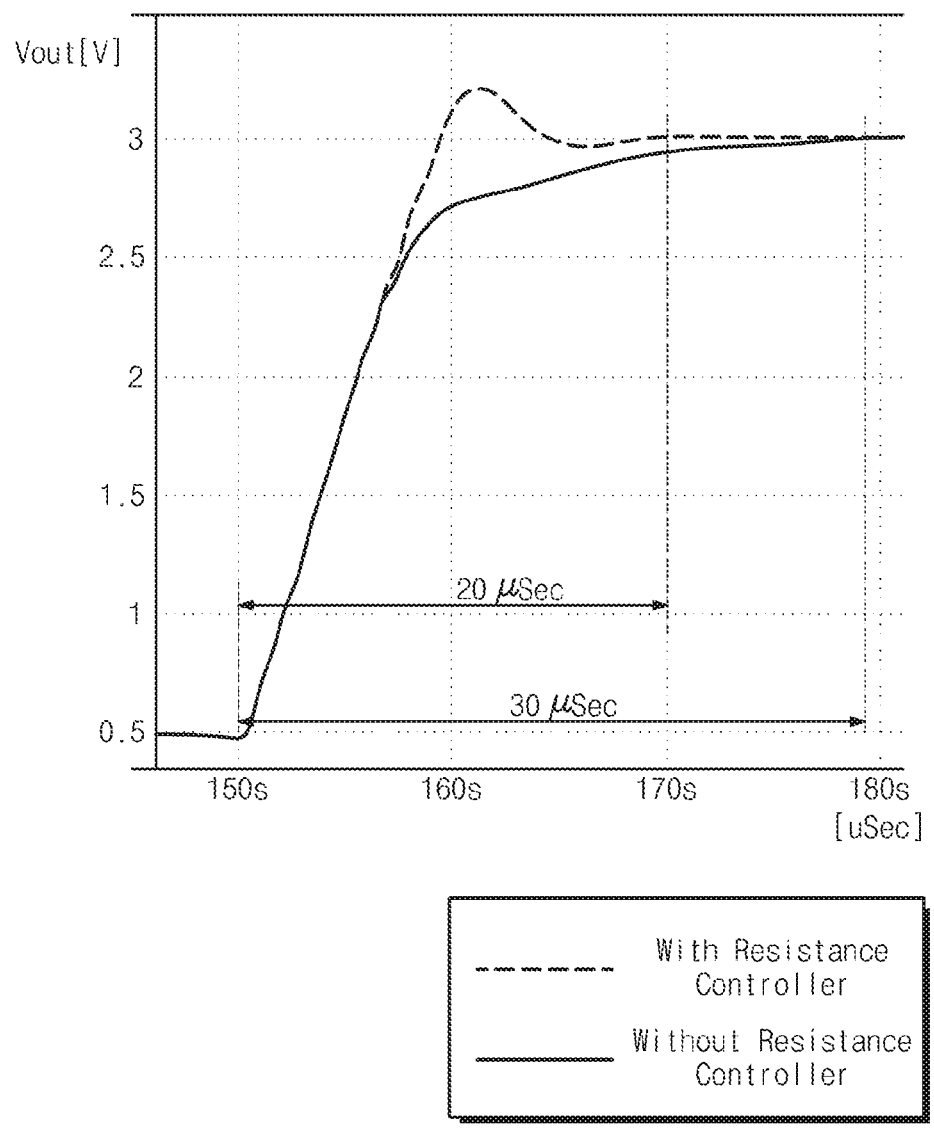
FIG. 8 is a graph illustrating a response characteristic of an output voltage of a power converting circuit including a resistance value adjuster according to an embodiment of the inventive concept, and a response characteristic of an output voltage of a power converting circuit not including the same.

FIG. 8 is a graph illustrating a response characteristic of an output voltage of a power converting circuit including a resistance value adjuster according to an embodiment of the inventive concept, and a response characteristic of an output voltage of a power converting circuit not including the same.

Referring to FIG. 8, for a power converting circuit including the resistance value control circuit 140 (refer to FIG. 1) according to an embodiment of the inventive concept, a time taken for the output voltage Vout to reach a target voltage (e.g., about 3 V) may become short compared to a power converting circuit not including the resistance value control circuit 140. For the power converting circuit including the resistance value control circuit 140, a time of about 20 is may be taken for the output voltage Vout to reach the target voltage. In contrast, for the power converting circuit not including the resistance value control circuit 140, a time of about 30 µs may be taken for the output voltage Vout to reach the target voltage.

With the above description, the power converting circuit 100 according to an embodiment of the inventive concept may adjust a feedback resistance value, and thus may obtain a high-speed response characteristic of the output voltage Vout.

Figure 9:
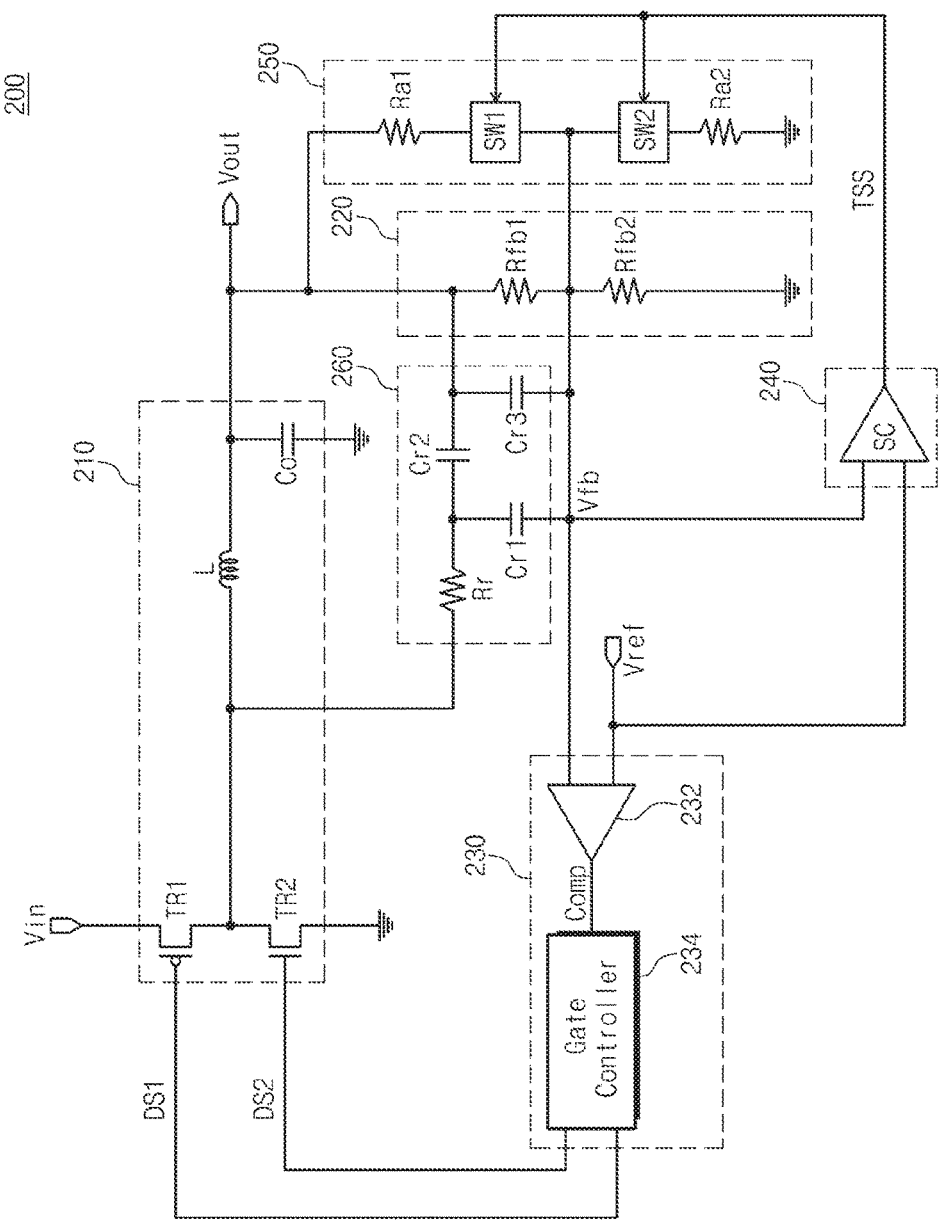
FIG. 9 is a schematic diagram illustrating a hysteresis buck converter as a power converting circuit, according to an embodiment of the inventive concept.

FIG. 9 is a schematic diagram illustrating a hysteresis buck converter as a power converting circuit, according to an embodiment of the inventive concept. Referring to FIG. 9, a hysteresis buck converter 200 according to an embodiment of the inventive concept includes a voltage converting circuit 210, a feedback circuit 220, a driving signal generator 230, a transient state detector 240, a resistance value adjuster 250, and a ripple voltage injection circuit 260. The hysteresis buck converter 200 may decrease (or step down) an input voltage Vin and may output an output voltage Vout according to the decreased voltage. That is, the hysteresis buck converter 200 may step down a level of the input voltage Vin and may output the stepped-down voltage level of the input voltage as the output voltage Vout.

The voltage converting circuit 210 includes a first transistor TR1, a second transistor TR2, an inductor L, and a capacitor Co.

One end of the first transistor TR1 is connected to a node for receiving the input voltage Vin. The second transistor TR2 is connected between the other end of the first transistor TR1 and a ground node. The first transistor TR1 and the second transistor TR2 may be sequentially turned on in response to the first driving signal DS1 and the second driving signal DS2, respectively.

A level of a current which flows through the inductor L by the input voltage Vin may increase when the first transistor TR1 is turned on and the second transistor TR2 is turned off. In contrast, a level of a current which flows through the inductor L by a ground voltage which is voltage level of the ground node may decrease when the first transistor TR1 is turned off and the second transistor TR2 is turned on. With the above-described operation, the output voltage Vout may be outputted through the inductor L.

The capacitor Co is connected between a node for outputting the output voltage Vout and the ground node. The capacitor Co may be connected to output the output voltage Vout stably.

The voltage converting circuit 210 may control turn-on and turn-off times of the first and second transistors TR1 and TR2 to adjust a level of the output voltage Vout.

The feedback circuit 220 includes a first feedback resistor Rfb1 and a second feedback resistor Rfb2. The feedback circuit 220 may divide the output voltage Vout in proportion to resistance values of the first feedback resistor Rfb1 and the second feedback resistor Rfb2 and may output a feedback voltage Vfb.

The driving signal generator 230 includes a hysteresis comparator 232 and a gate controller 234.

The hysteresis comparator 232 may compare the feedback voltage Vfb and a reference voltage Vref and may output a comparison signal COMP. Here, the reference voltage Vref may include a first hysteresis threshold voltage and a second hysteresis threshold voltage. In embodiments of the inventive concept, the hysteresis comparator 232 may output the comparison signal COMP having a logic "high" state when a level of the feedback voltage Vfb is higher than that of the first hysteresis threshold voltage. In contrast, while outputting logic "high", the hysteresis comparator 232 may output the comparison signal COMP having a logic "low" state when a level of the feedback voltage Vfb is lower than that of the second hysteresis threshold voltage. It should be understood that the hysteresis comparator 132 is set to operate contrary to the above-described output manner The gate controller 234 may output the first driving signal DS1 and the second driving signal DS2 in response to the comparison signal COMP. The first driving signal DS1 and the second driving signal DS2 may be used to turn on or off the first and second transistors TR1 and TR2 of the voltage converting circuit 210. Logic states of the first and second driving signals DS1 and DS2 may vary according to a change in a transient state of the feedback voltage Vfb which is obtained by dividing the output voltage Vout.

The transient state detector 240 includes a state comparator SC. The state comparator SC may receive the feedback voltage Vfb and the reference voltage Vref and may output a transient state signal TSS. The transient state signal TSS may be a signal corresponding to a transient state of an output voltage Vout. In exemplary embodiments, the transient state signal TSS may remain at a logic "high" state during a rising transient section of the output signal Vout and may remain at a logic "low" state during the remaining section other than the rising transient section.

The resistance value adjuster 250 includes a first adjustment resistor Ra1 which is connected in parallel with the first feedback resistor Rfb1 or is disconnected there from, based on whether a first switch SW1 is turned off or on. The resistance value adjuster 250 further includes a second adjustment resistor Ra2 which is connected in parallel with the second feedback resistor Rfb2 or is disconnected there from, based on whether a second switch SW2 is turned off or on.

The first switch SW1 and the second switch SW2 may be turned on or off in response to the transient state signal TSS. In embodiments of the inventive concept, the first switch SW1 and the second switch SW2 may be turned on in response to the transient state signal TSS corresponding to a rising transient state of the output voltage Vout.

When the first switch SW1 is turned on, the first feedback resistor Rfb1 and the first adjustment resistor Ra1 may be connected in parallel with each other. When the second switch SW2 is turned on, the second feedback resistor Rfb2 and the second adjustment resistor Ra2 may be connected in parallel with each other. Here, a feedback resistance value being an equivalent resistance value of the first feedback resistor Rfb1 and the first adjustment resistor Ra1 connected in parallel with each other may be smaller than that of the first feedback resistor Rfb1. Likewise, a feedback resistance value being an equivalent resistance value of the second feedback resistor Rfb2 and the second adjustment resistor Ra2 connected in parallel with each other may be smaller than that of the second feedback resistor Rfb2.

When the first and second switches SW1 and SW2 are turned off, a connection between the first feedback resistor Rfb1 and the first adjustment resistor Ra1, and a connection between the second feedback resistor Rfb2 and the second adjustment resistor Ra2 may be cut. In this case, a feedback resistance value of the hysteresis buck converter 200 may be a resistance value of the first and second feedback resistors Rfb1 and Rfb2.

The ripple voltage injection circuit 260 includes an impedance element and reactance elements. The ripple voltage injection circuit 260 includes a resistor Rr as the impedance element, and a plurality of capacitors Cr1, Cr2, and Cr3 as the reactance elements. The ripple voltage injection circuit 260 may provide a node, from which the feedback voltage Vfb is outputted, with a ripple voltage for changing a logic state of the comparison signal COMP being an output of a hysteresis comparator 232.

When the output voltage Vout is detected as increasing, the hysteresis buck converter 200 according to an embodiment of the inventive concept may decrease a feedback resistance value, and thus may make a rising transient speed of the output voltage Vout fast. With the above description, a time taken for the output voltage Vout to reach a target voltage may be shortened compared to the case that a feedback resistance value is fixed. That is, a high-speed response characteristic may be obtained.

Furthermore, the hysteresis buck converter 200 according to an embodiment of the inventive concept may decrease a feedback resistance value during a section where the output voltage Vout increases and may maintain an original feedback resistance value during the remaining section, thereby making it possible to limit instability of the output voltage Vout within a specific section.

Figure 10:
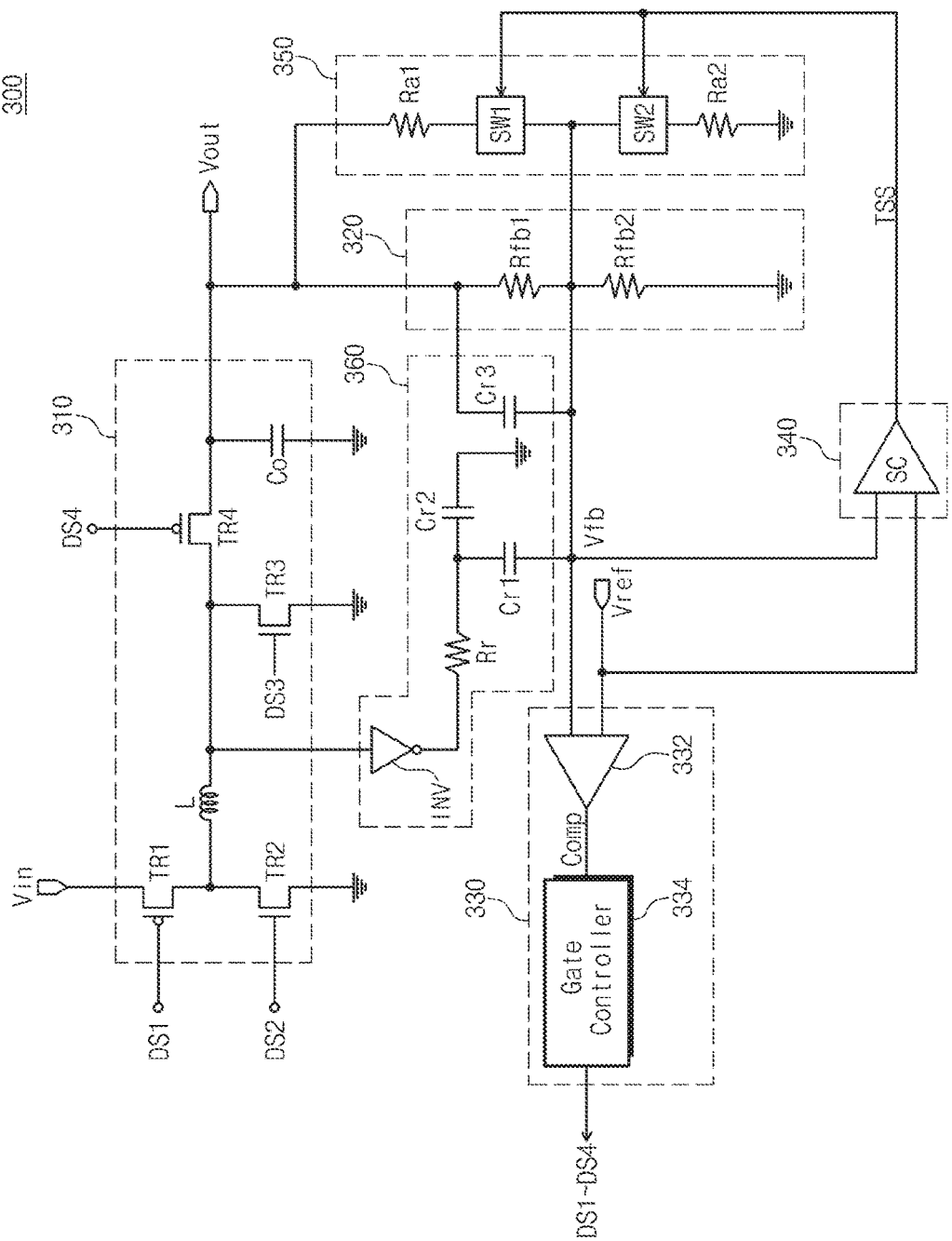
FIG. 10 is a schematic diagram illustrating a non-inverting buck-boost converter as a power converting circuit, according to another embodiment of the inventive concept.

FIG. 10 is a schematic diagram illustrating a non-inverting buck-boost converter as a power converting circuit, according to another embodiment of the inventive concept. Referring to FIG. 10, a non-inverting buck-boost converter 300 according to an embodiment of the inventive concept includes a voltage converting circuit 310, a feedback circuit 320, a driving signal generator 330, a transient state detector 340, a resistance value adjuster 350, and a ripple voltage injection circuit 360.

The non-inverting buck-boost converter 300 may increase (or step up) an input voltage Vin and may output the stepped-up voltage as an output voltage Vout. That is, the non-inverting buck-boost converter 300 may increase a level of the input voltage Vin and may output an output voltage Vout of the same phase as the input voltage Vin.

The feedback circuit 320, the transient state detector 340, and the resistance value adjuster 350 may be configured substantially the same as a feedback circuit 220, a transient state detector 240, and a resistance value adjuster 250 of FIG. 9, and a duplicated description is thus omitted.

The voltage converting circuit 310 includes a first transistor TR1, a second transistor TR2, a third transistor TR3, a fourth transistor TR4, an inductor L, and a capacitor Co. The voltage converting circuit 310 may control turn-on and turn-off times of the first to fourth transistors TR1 to TR4 to adjust a level of an output voltage Vout.

The driving signal generator 330 may generate first to fourth driving signals DS1 to DS4 respectively controlling the first to fourth transistors TR1 to TR4 in response to a comparison signal COMP which is generated as a result of comparing a feedback voltage Vfb and a reference voltage Vref. An input voltage of which the level is adjusted when the first to fourth transistors TR1 to TR4 are turned on and off according to the first to fourth driving signals DS1 to DS4 may be outputted as the output voltage Vout.

The ripple voltage injection circuit 360 includes an impedance element, reactance elements, and an inverter. The ripple voltage injection circuit 360 includes a resistor Rr as the impedance element, a plurality of capacitors Cr1, Cr2, and Cr3 as the reactance elements, and an inverter INV. The ripple voltage injection circuit 360 may provide a node, from which the feedback voltage Vfb is outputted, with a ripple voltage for changing a logic state of the comparison signal COMP being an output of a hysteresis comparator 332.

The non-inverting buck-boost converter 300 according to an embodiment of the inventive concept may obtain a high-speed rising transient speed of the output voltage Vout by means of the transient state detector 340 and the resistance value adjuster 350. To this end, the transient state detector 340 may detect a rising transient state of the output voltage Vout. In the case where the output voltage Vout remains at the rising transient state, the resistance value adjuster 350 may decrease feedback resistance value of the non-inverting buck-boost converter 300, thereby improving a response characteristic of the output voltage Vout.

Figure 11:
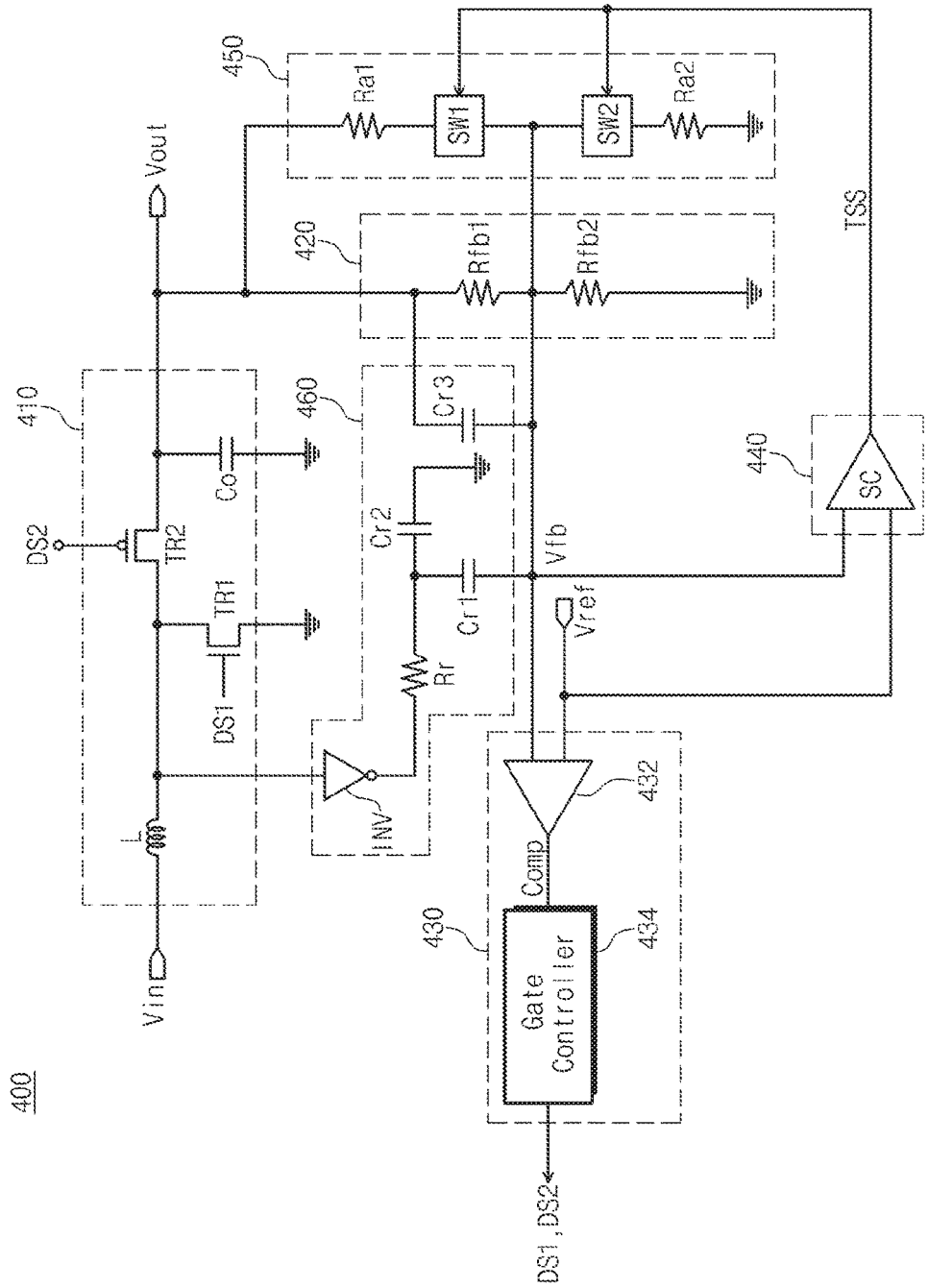
FIG. 11 is a schematic diagram illustrating a boost converter as a power converting circuit, according to another embodiment of the inventive concept.

FIG. 11 is a schematic diagram illustrating a boost converter as a power converting circuit, according to another embodiment of the inventive concept. Referring to FIG. 11, a boost converter 400 according to an embodiment of the inventive concept includes a voltage converting circuit 410, a feedback circuit 420, a driving signal generator 430, a transient state detector 440, a resistance value adjuster 450, and a ripple voltage injection circuit 460. The boost converter 400 may increase (or step up) an input voltage Vin and may output the stepped-up voltage as an output voltage Vout.

The feedback circuit 420, the transient state detector 440, the resistance value adjuster 450, and the ripple voltage injection circuit 460 may be configured substantially the same as a feedback circuit 220, a transient state detector 240, a resistance value adjuster 250, and a ripple voltage injection circuit 260 of FIG. 8, and a duplicated description is thus omitted.

The voltage converting circuit 410 includes a first transistor TR1, a second transistor TR2, an inductor L, and a capacitor Co. The voltage converting circuit 410 may control turn-on and turn-off times of the first and second transistors TR1 and TR2 to adjust a level of an output voltage Vout.

The driving signal generator 430 may generate first and second driving signals DS1 and DS2 respectively controlling the first and second transistors TR1 and TR2 in response to a comparison signal COMP which is generated as a result of comparing a feedback voltage Vfb and a reference voltage Vref. An input voltage Vin of which the level is adjusted when the first and second transistors TR1 and TR2 are turned on and off according to the first and second driving signals DS1 and DS2 may be outputted as the output voltage Vout.

The boost converter 400 according to an embodiment of the inventive concept may improve a rising transient speed of the output voltage Vout by means of the transient state detector 440 and the resistance value adjuster 450. To this end, the transient state detector 440 may detect a rising transient state of the output voltage Vout. In the case where the output voltage Vout remains at the rising transient state, the resistance value adjuster 450 may decrease a feedback resistance value of the non-inverting buck-boost converter 300, thereby improving a response characteristic of the output voltage Vout.

Each of power converting circuits described with reference to FIGS. 9 to 11 may include a transient state detector and a resistance value adjuster. Each of the power converting circuits described with reference to FIGS. 9 to 11 may decrease a feedback resistance value when a rising transient state of the output voltage Vout is detected, thereby improving the rising transient speed of the output voltage Vout. This may mean that the output voltage Vout reaches a target voltage more quickly.

Figure 12:
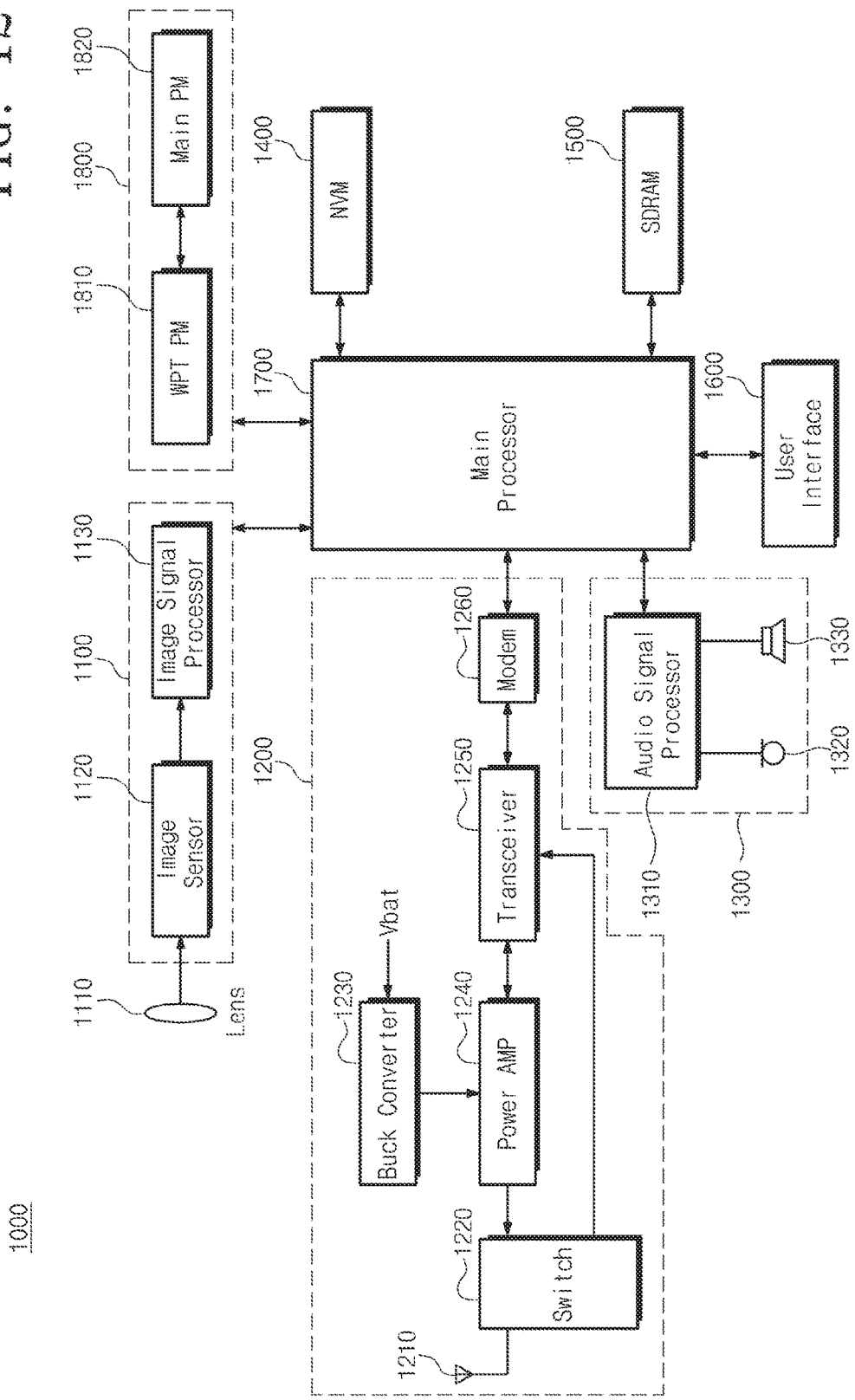
FIG. 12 is a block diagram illustrating a portable device including a hysteresis buck converter, according to an embodiment of the inventive concept.

FIG. 12 is a block diagram illustrating a portable device including a hysteresis buck converter, according to an embodiment of the inventive concept. Referring to FIG. 12, a portable device 1000 includes an image processing unit 1100, a wireless communication unit 1200, an audio processing unit 1300, a nonvolatile memory 1400, a synchronous dynamic random access memory (SDRAM) 1500, a user interface 1600, a main processor 1700, and a power management unit 1800. The portable device 1000 may be, for example, a mobile terminal, a portable personal assistant (PDA), a personal media player (PMP), a digital camera, a smart phone, a tablet or the like.

The image processing unit 1100 may receive light through a lens 1110. An image sensor 1120 and an image signal processor 1130 which are included in the image processing unit 1100 may generate an image by means of the received light.

The wireless communication unit 1200 includes an antenna 1210, a switch 1220, a hysteresis buck converter 1230, a power amplifier 1240, a transceiver 1250, and a modem 1260.

The switch 1220 may selectively connect the antenna 1210 to the power amplifier 1240 or the transceiver 1250 based on a transmission or reception mode of the wireless communication unit 1200.

The hysteresis buck converter 1230 according to an embodiment of the inventive concept may decrease (or step down) a voltage Vbat from a battery and may provide the decreased voltage as a power supply voltage of the power amplifier 1240. The hysteresis buck converter 1230 according to an embodiment of the inventive concept may adjust feedback resistance value and may improve a rising transient speed of an output voltage.

The power amplifier 1240 may amplify an RF signal from the transceiver 1250 and may output the amplified signal to the antenna 1210. When supplied with a power supply voltage of which the form corresponds to the form of an RF signal to be amplified, the power amplifier 1240 may improve amplification efficiency thereof. In other words, in the case of using the hysteresis buck converter 1230 according to an embodiment of the inventive concept, a power supply voltage which corresponds to the form of an RF signal varying quickly may be supplied to the power amplifier 1240, thereby improving the amplification efficiency of the power amplifier 1240. In the case where the amplification efficiency of the power amplifier 1240 is improved, power efficiency of the portable device 1000 may be improved.

The wireless communication unit 1200 may communicate with an external device of the portable device 1000 based on various wireless communication protocols such as long term evolution (LTE), WiMax, global system for mobile communication (GSM), code division multiple access (CDMA), Bluetooth, near field communication (NFC), Wi-Fi, radio frequency identification (RFID), and the like.

The audio processing unit 1300 may process an audio signal by means of an audio signal processor 1310, a microphone 1320, and a speaker 1330. The nonvolatile memory 1400 may be, for example, a NAND flash memory, a phase-change RAM (PRAM), a magneto-resistive RAM (MRAM), a resistive RAM (RRAM), a ferroelectric RAM (FRAM), a NOR flash memory or the like. Alternatively, the nonvolatile memory 1400 may include different types of memories. The SDRAM 1500 may temporarily store data used to operate the portable device 1000. The SDRAM 1500 may be used as a working memory, an operation memory, a buffer memory, and the like of the portable device 1000.

The user interface 1600 may enable communication between a user and the portable device 1000 under a control of the main processor 1700. For example, the user interface 1600 may include input interfaces such as a keyboard, a keypad, buttons, a touch panel, a touch screen, a touch pad, a touch ball, a camera, a microphone, a gyroscope sensor, a vibration sensor, and the like. The user interface 1600 may further include output interfaces, a display device, a motor, and the like. For example, the display device may be a liquid crystal display (LCD), an organic light-emitting diode (OLED) display, an active matrix OLED (AMOLED) display, a light-emitting diode, or the like.

The main processor 1700 may control an overall operation of the portable device 1000. The image processing unit 1100, the wireless communication unit 1200, the audio processing unit 1300, the nonvolatile memory 1400, the SDRAM 1500, and the power management unit 1800 may execute a user instruction, which is provided through the user interface 1600, under a control of the main processor 1700. Alternatively, the image processing unit 1100, the wireless communication unit 1200, the audio processing unit 1300, the nonvolatile memory 1400, the SDRAM 1500, and the power management unit 1800 may provide a user with information through the user interface 1600 under a control of the main processor 1700. The main processor 1700 may be implemented with a system on chip (SoC). In embodiments of the inventive concept, the main processor 1700 may be an application processor.

The power management unit 1800 may manage power needed to operate the portable device 1000. The power management unit 1800 includes a wireless power transmission management unit 1810 and a main power management unit 1820.

Figure 13:
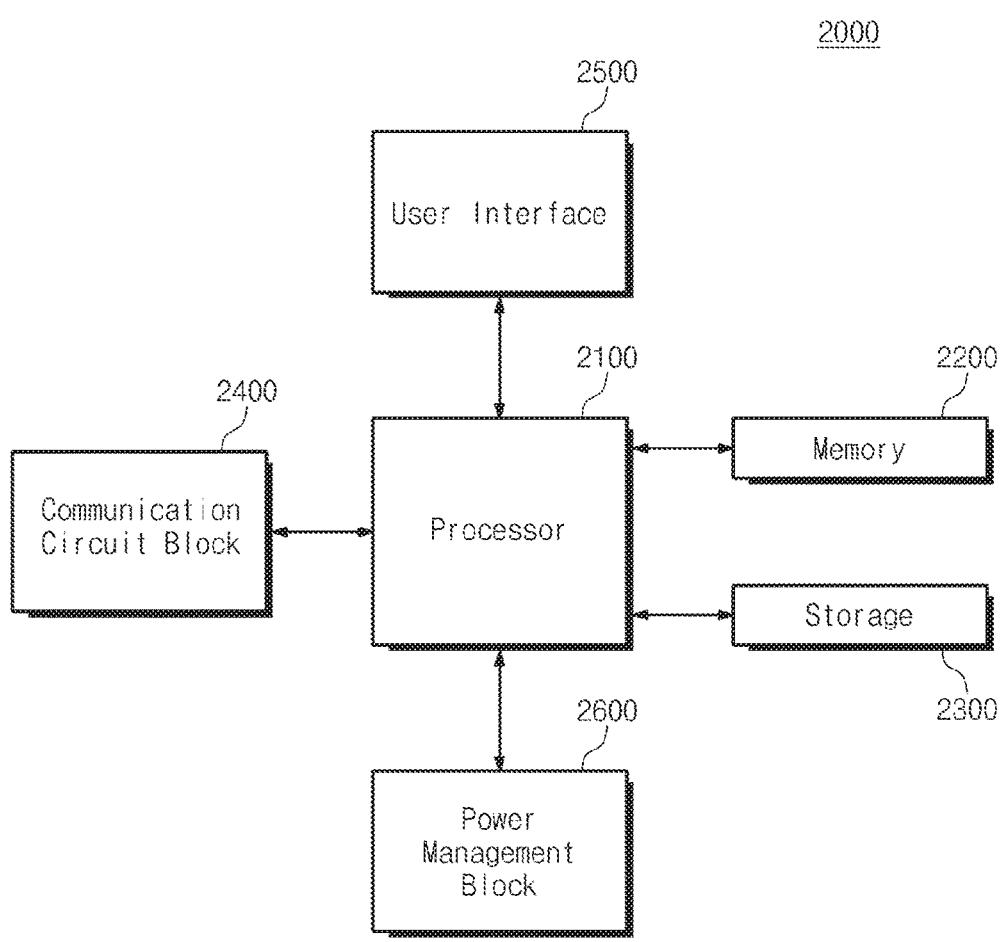
FIG. 13 is a block diagram illustrating an electronic device including a hysteresis buck converter, according to an embodiment of the inventive concept.

FIG. 13 is a block diagram illustrating an electronic device including a hysteresis buck converter, according to an embodiment of the inventive concept. Referring to FIG. 13, an electronic device 2000 includes a processor 2100, a memory 2200, storage 2300, a communication circuit block 2400, a user interface 2500, and a power management block 2600. In embodiments of the inventive concept, the electronic device 2000 may be a computer, a tablet, or a wearable device.

The processor 2100 may control an overall operation of the electronic device 2000. In embodiments of the inventive concept, the processor 2100 may be an application processor. Alternatively, the processor 2100 may be a general-purpose or workstation processor.

The memory 2200 may temporarily store data used to operate the electronic device 2000. The memory 2200 may exchange data with the processor 2100. The memory 2200 may be used as a working memory, an operation memory, a buffer memory, and the like of the electronic device 2000. In embodiments of the inventive concept, the memory 2200 may include a volatile memory, such as a static RAM (SRAM), a DRAM, an SDRAM or the like, or a nonvolatile memory, such as a PRAM, an MRAM, a ReRAM, a FRAM, or the like. The memory 2200 may include one or more memory modules or one or more memory packages.

The storage 2300 may store data to be retained. In embodiments of the inventive concept, the storage 2300 may include a nonvolatile memory such as a flash memory, a PRAM, an MRAM, a ReRAM, a FRAM, or the like. In embodiments of the inventive concept, the storage 2300 may be a memory card such as an embedded multimedia card (eMMC).

The communication circuit block 2400 may communicate with an external device of the electronic device 2000 under a control of the processor 2100. The communication circuit block 2400 may include the hysteresis buck converter 200 (refer to FIG. 6) according to an embodiment of the inventive concept. The hysteresis buck converter 200 according to an embodiment of the inventive concept may quickly increase a rising transient speed of an output voltage, thereby improving the amplification efficiency of an amplifier amplifying an RF signal. In the case where the amplification efficiency of the amplifier is improved, power efficiency of the electronic device 2000 may be improved. The communication circuit block 2400 may communicate with an external device of the electronic device 2000 based on a wired or wireless communication protocol. For example, the communication circuit block 2400 may communicate with the external device, based on at least one of wireless communications manners such as LTE, WiMax, GSM, CDMA, Bluetooth, NFC, Wi-Fi, RFID, and the like, or wired communications manners such as universal serial bus (USB), small computer system interface (SCSI), peripheral component interconnection (PCI) express, advanced technology attachment (ATA), parallel ATA (PATA), serial ATA (SATA), serial attached SCSI (SAS), integrated drive electronics (IDE), Firewire, and the like.

The user interface 2500 may enable communications between a user and the electronic device 2000 under a control of the processor 2100. For example, the user interface 1600 may include input interfaces such as a keyboard, a keypad, buttons, a touch panel, a touch screen, a touch pad, a touch ball, a camera, a microphone, a gyroscope sensor, a vibration sensor, and so on. The user interface 1600 may further include output interfaces such as an LCD, an OLED display device, an AMOLED display device, an LED, a speaker, a motor, and the like.

The power management block 2600 may manage power needed to operate the electronic device 2000.

Processors, memories, and circuits according to embodiments of the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 14:
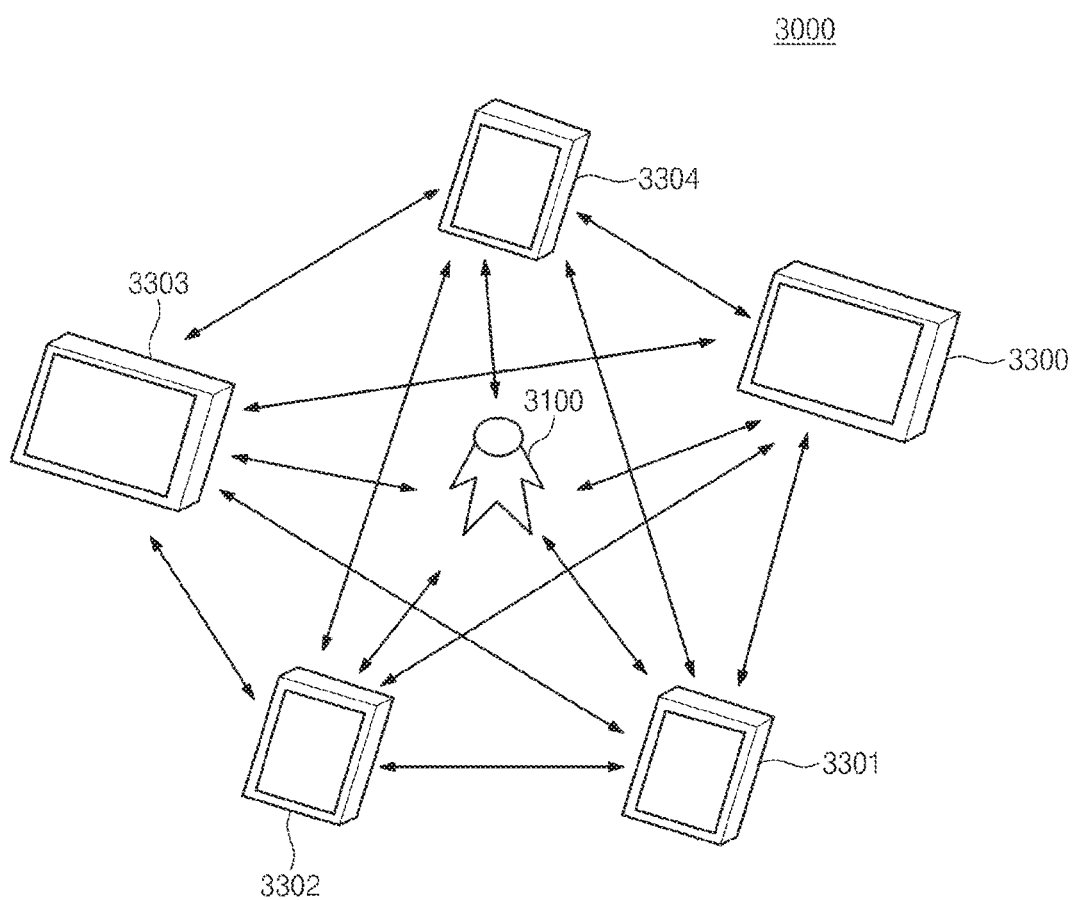
FIG. 14 is a diagram illustrating a user and an internet system including electronic devices implemented according to an embodiment of the inventive concept.

FIG. 14 is a diagram illustrating a user and an internet system including electronic devices implemented according to an embodiment of the inventive concept.

Each of electronic devices 3300 to 3304 may be, for example, a computer, a mobile terminal, a PDA, a PMP, a digital camera, a smart phone, a tablet, or a wearable device. Each of the electronic devices 3300 to 3304 may be implemented according to an embodiment of the inventive concept. Each of the electronic devices 3300 to 3304 may include the wireless communication unit 1200 (refer to FIG. 12), thereby improving power efficiency of each of the electronic devices 3300 to 3304.

Each of the electronic devices 3300 to 3304 may exchange information with a user 3100. The electronic devices 3300 to 3304 may exchange information with each other. The user 3100 and the electronic devices 3300 to 3304 may mutually exchange information through an internet.

The configuration illustrated in each schematic diagram should be understood conceptually. A shape, a structure, and a size of each component included in a schematic diagram may be exaggerated or downsized for understanding of the inventive concept. An actually implemented configuration may have a physical shape different from a configuration of each schematic diagram. Each schematic diagram should not limit a physical shape of each component.

A device configuration illustrated in each block diagram is presented to help understanding of the inventive concepts. Each block may be composed of smaller blocks according to a function. Alternatively, a plurality of blocks may constitute a large unit of block according to a function. That is, the scope and spirit of the inventive concepts should not be limited to components illustrated in a block diagram.

According to embodiments of the inventive concept, a power converting circuit may obtain a fast response characteristic while maintaining low power consumption and stability of an output voltage.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A power converting circuit comprising:
   a voltage converting circuit configured to change a voltage level of an input voltage in response to a driving signal and to output an output voltage according to the changed voltage level of the input voltage;
   a feedback circuit configured to divide the output voltage and to output the divided output voltage as a feedback voltage;
   a driving signal generator configured to compare a level of the feedback voltage with a level of a reference voltage and to output the driving signal;
   a transient state detector configured to compare the level of the feedback voltage with the level of the reference voltage and to output a transient state signal corresponding to a transient state of the output voltage; and
   a resistance value adjuster configured to change a feedback resistance value of the feedback circuit in response to the transient state signal,
   wherein the feedback circuit is configured to divide the output voltage by the feedback resistance value.

2. The power converting circuit of claim 1, wherein the driving signal comprises first and second driving signals, and the voltage converting circuit comprises:
   a first transistor configured to transfer the input voltage provided to a first end of the first transistor to a second end of the first transistor in response to the first driving signal;
   a second transistor configured to transfer a ground voltage at a first end of the second transistor to a second end of the second transistor in response to the second driving signal;
   an inductor connected between the second end of the first transistor and an output node; and
   a capacitor connected between the output node and a ground node,
   wherein the voltage converting circuit is configured to output the output voltage to the output node.

3. The power converting circuit of claim 2, wherein the first transistor and the second transistor are sequentially turned on in response to the first driving signal and the second driving signal, respectively.

4. The power converting circuit of claim 2, wherein the driving signal generator comprises:
   a hysteresis comparator configured to compare the level of the feedback voltage with the level of the reference voltage and to output a comparison signal; and
   a gate controller configured to output the first driving signal and the second driving signal to a gate of the first transistor and a gate of the second transistor respectively in response to the comparison signal.

5. The power converting circuit of claim 2, wherein the feedback circuit comprises:
a first feedback resistor connected between the output node and a feedback voltage node, and configured to output the feedback voltage via the feedback voltage node; and
a second feedback resistor connected between the feedback voltage node and the ground node.

6. The power converting circuit of claim 5, wherein the feedback voltage node is connected to the resistance value adjuster.

7. The power converting circuit of claim 1, wherein the transient state signal comprises first and second transient state signals, and the transient state detector comprises:
a state comparator configured to compare the level of the feedback voltage with the level of the reference voltage, and output the first transient state signal and the second transient state signal, and
wherein the state comparator is configured to output the first transient state signal during a first section from a first time point at which a level difference between the feedback voltage and the reference voltage is greater than a threshold voltage of the state comparator, to a second time point at which a level difference between the feedback voltage and the reference voltage is less than the threshold voltage of the state comparator, and to output the second transient state signal during a second section other than the first section.

8. The power converting circuit of claim 7, wherein logic states of the first and second transient state signals are complementary to each other.

9. The power converting circuit of claim 7, wherein the resistance value adjuster is configured to change the feedback resistance value from a first value to a second value responsive to the first transient state signal, and to change the feedback resistance value from the second value to the first value responsive to the second transient state signal.

10. The power converting circuit of claim 9, wherein the second value is less than the first value.

11. A hysteresis buck converter, comprising:
a feedback circuit configured to divide an output voltage and to output the divided output voltage as a feedback voltage;
a hysteresis comparator configured to compare a level of the feedback voltage with a level of a reference voltage and to output a comparison signal;
a voltage converting circuit configured to pull up or down an input voltage based on the comparison signal and to output the pulled-up or pulled-down voltage as the output voltage; and
a resistance value control circuit configured to change a feedback resistance value of the feedback circuit based on a transient state of the feedback voltage,
wherein the feedback circuit is configured to divide the output voltage by the feedback resistance value, and
wherein the resistance value control circuit is configured to decrease the feedback resistance value during a rising transient section of the feedback voltage.

12. The hysteresis buck converter of claim 11, wherein the resistance value control circuit comprises:
a state comparator configured to compare the level of the feedback voltage with the level of the reference voltage and to output a transient state signal including information corresponding to the transient state of the feedback voltage; and
a resistance value adjuster configured to change the feedback resistance value in response to the transient state signal.

13. The hysteresis buck converter of claim 12, wherein the transient state signal comprises first and second transient state signals, and
the state comparator is configured to output the first transient state signal during a first section from a first time point at which a level difference between the feedback voltage and the reference voltage is greater than a threshold voltage of the state comparator, to a second time point at which a level difference between the feedback voltage and the reference voltage is less than the threshold voltage of the state comparator, and to output the second transient state signal during a second section other than the first section.

14. The hysteresis buck converter of claim 13, wherein the resistance value adjuster decreases the feedback resistance value in response to the first transient state signal.

15. The hysteresis buck converter of claim 14, wherein the resistance value adjuster is configured to adjust the decreased feedback resistance value to the feedback resistance value before decreasing in response to the second transient state signal.

16. A power converting circuit comprising:
a voltage converting circuit configured to output an output voltage based on an input voltage and a driving signal;
a feedback circuit configured to divide the output voltage and to output the divided output voltage as a feedback voltage;
a ripple voltage injection circuit configured to inject a ripple voltage to a feedback node outputting the feedback voltage to provide a ripple injected feedback voltage;
a driving signal generator configured to compare a level of the ripple injected feedback voltage with a level of a reference voltage and to output the driving signal; and
a resistance value control circuit configured to change a feedback resistance value of the feedback circuit in response to a transient state of the ripple injected feedback voltage,
wherein the feedback circuit is configured to divide the output voltage by the feedback resistance value, and
wherein the resistance value control circuit decreases the feedback resistance value during a rising transient section of the ripple injected feedback voltage.

17. The power converting circuit of claim 16, wherein the resistance value control circuit comprises:
a transient state detector configured to compare the level of the ripple injected feedback voltage with the level of the reference voltage and to output a transient state signal corresponding to the transient state of the output voltage; and
a resistance value adjuster configured to change the feedback resistance value in response to the transient state signal.

18. The power converting circuit of claim 17, wherein the transient state signal comprises first and second transient state signals, and the transient state detector comprises:
a state comparator configured to compare the level of the ripple injected feedback voltage with the level of the reference voltage, and
wherein the state comparator is configured to output the first transient state signal during a first section from a first time point at which a level difference between the ripple injected feedback voltage and the reference voltage is greater than a threshold voltage of the state comparator, to a second time point at which a level difference between the ripple injected feedback voltage and the reference voltage is less than the threshold voltage of the state comparator, and to output the second transient state signal during a second section other than the first section.

19. The power converting circuit of claim 18, wherein the resistance value adjuster is configured to change the feedback resistance value from a first value to a second value responsive to the first transient state signal and to change the feedback resistance value from the second value to the first value responsive to the second transient state signal.

20. The power converting circuit of claim 19, wherein the second value is less than the first value.

* * * * *